United States Patent
Allman et al.

(10) Patent No.: US 6,342,734 B1
(45) Date of Patent: Jan. 29, 2002

(54) INTERCONNECT-INTEGRATED METAL-INSULATOR-METAL CAPACITOR AND METHOD OF FABRICATING SAME

(75) Inventors: Derryl D. J. Allman; John Q. Walker, both of Colorado Springs, CO (US); Verne C. Hornback, Troutdale, OR (US); Todd A. Randazzo, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/559,934

(22) Filed: Apr. 27, 2000

(51) Int. Cl.[7] .................. H01L 23/48; H01L 23/52; H01L 29/40
(52) U.S. Cl. .................. 257/758; 257/296
(58) Field of Search .................. 257/296, 301, 257/303, 306, 535, 758

(56) References Cited

U.S. PATENT DOCUMENTS

| | | |
|---|---|---|
| 4,437,139 A | 3/1984 | Howard |
| 4,912,535 A | 3/1990 | Okumura |
| 5,095,346 A | 3/1992 | Bae et al. |
| 5,101,251 A | 3/1992 | Wakamiya et al. |
| 5,155,657 A | 10/1992 | Oehrlein et al. |
| 5,187,637 A | 2/1993 | Embree |
| 5,195,018 A | 3/1993 | Kwon et al. |
| 5,240,871 A | 8/1993 | Doan et al. |
| 5,273,925 A | 12/1993 | Yamanaka |
| 5,281,837 A * | 1/1994 | Kohyama .................. 257/296 |
| 5,366,920 A * | 11/1994 | Yamamichi et al. ........ 257/306 |
| 5,381,365 A | 1/1995 | Ajika et al. |
| 5,394,000 A | 2/1995 | Ellul et al. |
| 5,434,812 A | 7/1995 | Tseng |
| 5,436,186 A | 7/1995 | Hsue et al. |
| 5,451,551 A | 9/1995 | Krishnan et al. |
| 5,494,854 A | 2/1996 | Jain |
| 5,494,857 A | 2/1996 | Cooperman et al. |
| 5,497,017 A | 3/1996 | Gonzales |
| 5,605,857 A | 2/1997 | Jost et al. |
| 5,654,581 A | 8/1997 | Radosevich et al. |
| 5,702,990 A | 12/1997 | Jost et al. |
| 5,708,303 A | 1/1998 | Jeng |
| 5,736,457 A | 4/1998 | Zhao |

(List continued on next page.)

FOREIGN PATENT DOCUMENTS

| | | |
|---|---|---|
| JP | 60253265 | 12/1985 |
| JP | 63087761 | 4/1988 |

OTHER PUBLICATIONS

Arjun Kar–Roy, et al., High Density Metal Capacitors Using PECVD Nitride for Mixed Signal and RF Circuits, 1999 IEEE, pp. 245–247.

Primary Examiner—David Nelms
Assistant Examiner—David Nhu
(74) Attorney, Agent, or Firm—John R. Ley, L.L.C.

(57) ABSTRACT

A metal-insulator-metal capacitor is formed between interconnect layers of an integrated circuit with one of the plates of the capacitor formed integrally with one of the interconnect layers. A dielectric layer is formed on top of the interconnect layer, and a top capacitor plate is formed thereon. A bottom plate is defined by the interconnect layer and extends laterally beyond the top plate so that via interconnects may connect to both plates. An intermetal dielectric (IMD) layer separates the interconnect layer and the capacitor from the next interconnect layer above, and the via interconnects are formed through the IMD layer to connect the above interconnect layer to the capacitor plates. The dielectric layer on top of the interconnect layer that defines the bottom plate and another dielectric layer formed on top of the top plate may serve as etch stops for forming the vias for the via interconnects to different levels.

15 Claims, 6 Drawing Sheets

U.S. PATENT DOCUMENTS

| | | |
|---|---|---|
| 5,739,579 A | 4/1998 | Chiang et al. |
| 5,742,471 A | 4/1998 | Barbee, Jr. et al. |
| 5,747,382 A | 5/1998 | Huang et al. |
| 5,753,948 A | 5/1998 | Nguyen et al. |
| 5,767,541 A | 6/1998 | Hanagasaki |
| 5,846,876 A | 12/1998 | Bandyopadhyay et al. |
| 5,913,141 A | 6/1999 | Bothra |
| 5,915,203 A | 6/1999 | Sengupta et al. |
| 5,925,932 A | 7/1999 | Tran et al. |
| 5,926,359 A * | 7/1999 | Greco et al. ............... 361/311 |
| 5,976,926 A | 11/1999 | Kirlin et al. |
| 5,981,374 A | 11/1999 | Dalal et al. |
| 6,025,226 A | 2/2000 | Gambino et al. |
| 6,057,571 A | 5/2000 | Miller et al. |
| 6,069,051 A | 5/2000 | Nguyen et al. |
| 6,081,021 A | 6/2000 | Gambino et al. |
| 6,100,155 A | 8/2000 | Hu |
| 6,144,051 A * | 11/2000 | Nishimura et al. ......... 257/277 |
| 6,180,097 B1 | 1/2001 | Roy |
| 6,197,650 B1 * | 3/2001 | Wu ............................ 438/386 |
| 6,232,187 B1 * | 5/2001 | Tsai ........................... 438/393 |

* cited by examiner

INTERCONNECT-INTEGRATED METAL-INSULATOR-METAL CAPACITOR AND METHOD OF FABRICATING SAME

CROSS-REFERENCE TO RELATED INVENTIONS

This invention is related to the following inventions, all of which are assigned to the assignee of the present invention: High Aspect Ratio Metal-to-Metal Linear Capacitor for an Integrated Circuit, U.S. patent application Ser. No. 09/052, 851, filed Mar. 31,1998; Method of Electrically Connecting and Isolating Components with Vertical Elements Extending between Interconnect Layers in an Integrated Circuit, U.S. patent application Ser. No. 09/052,793, filed Mar. 31, 1998; Vertical Interdigitated Metal-Insulator-Metal Capacitor for an Integrated Circuit, U.S. patent application Ser. No. 09/219,655, filed Dec. 23,1998; Method of Forming and Electrically Connecting a Vertical Interdigitated Metal-Insulator-Metal Capacitor Extending between Interconnect Layers in an Integrated Circuit, U.S. patent application Ser. No. 09/221,023, filed Dec. 23,1998; Interconnect-Embedded Metal-Insulator-Metal Capacitor and Method of Fabricating Same, U.S. patent application Ser. No. 09/496, 971, filed Feb. 2, 2000; and Encapsulated-Metal Vertical-Interdigitated Capacitor and Damascene Method of Manufacturing Same, U.S. patent application Ser. No. (LSI Docket No. 98-210), filed Mar. 15, 2000. The disclosures of these aforementioned U.S. patent applications are hereby incorporated by this reference.

FIELD OF THE INVENTION

This invention relates to electronic integrated circuits (ICs) of the type having multiple layers of metal interconnects formed on top of one another on a substrate of the IC. More particularly, the present invention relates to a new and improved metal-insulator-metal (MIM) capacitor integrally formed with electrical conductors of an interconnect layer of the IC. Forming the capacitor integrally with the electrical conductors of the interconnect layer facilitates the integration of the capacitor fabrication process into the overall IC fabrication process by using conventional photolithographic and etching process steps to form a capacitor construction of relatively straightforward characteristics and to achieve more precise, predictable and linear response characteristics from the capacitor, among other things.

BACKGROUND OF THE INVENTION

The ongoing advances in the field of fabricating miniaturized electronic integrated circuits (ICs) has involved the fabrication of multiple layers of interconnects. Interconnects refer to the layer of separate electrical conductors which are formed on top of the substrate and which connect various functional components of the IC. Electrical connections between the interconnect layers and the functional components on the substrate are achieved by "via interconnects," which are post-like or plug-like vertical connections between the conductors of the interconnect layers and the devices on the surface of the substrate. Presently manufactured ICs often use five or more interconnect layers to connect together components of the IC.

Only a relatively short time ago, it was impossible or very difficult to construct an IC with more than one or two layers of interconnects. The topography variations created by previous layers resulted in a significant depth of focus problem with the lithographic process such that any further additions of layers were nearly impossible to achieve. However, recent advances in semiconductor fabrication planarization techniques, such as chemical mechanical polishing (CMP), have been successful in smoothing relatively significant variations in the height or topography of the previously deposited layers. As a result of the smoothing, or planarization, conventional lithographic processes are repetitively employed without significant limitation to form considerably more layers of interconnects than had previously been possible.

Low resistance metal routes with minimal coupling capacitance are a critical consideration in the design of an IC. Thus, great attention has been focused upon optimizing the distance (space) between interconnect layers. Normally the space between the interconnect layers is occupied by an insulating material, known as an intermetal dielectric (IMD), to insulate the electrical signals conducted by the various conductors of the interconnect layers from each other and from the functional components in the underlying substrate.

One effective use for the space between the interconnect layers is to incorporate capacitors between the interconnect layers in the IMD insulating material separating the interconnect layers. These capacitors form part of the functional components of the IC. Previously, capacitors were constructed alongside other structures, such as transistors, so the capacitors were formed of generally the same material used to construct the functional components on the substrate, such as polysilicon. Capacitors formed of these materials are generally known as poly plate capacitors. The aforementioned inventions described in the referenced U.S. patent applications focus on different techniques for combining capacitors with the conductors of the interconnect layers to achieve desirable functional effects within the IC.

Because the conductors of the interconnect layers are metal in construction, the capacitors formed between the interconnect layers are preferably of a metalin-sulator-metal (MIM) construction to take advantage of processing steps and performance enhancements. A MIM capacitor has metal plates, usually formed on the metal conductors of the interconnect layers. Because metal fabrication is required for the conductors of the interconnect layers, the simultaneous or near-simultaneous formation of the metal capacitor plates is readily accomplished without significant additional process steps and manufacturing costs. The fifth above identified invention describes a technique for the simultaneous formation of the capacitor embedded within an interconnect layer. Thus, at least part of the capacitor is readily fabricated without significant additional process steps and manufacturing costs.

Forming other parts of the capacitor between the interconnects does, however, require additional process steps. The process steps may be particularly difficult to execute when the components of the capacitor are three-dimensional in nature, such as U-shaped capacitor plates, or when the shape of the capacitor plates require unusual configurations for connection to the via interconnects.

A capacitor fabrication technique used to make polycrystalline silicon plate capacitors, poly plate capacitors, is very efficient and well known. Poly plate capacitors have horizontal plates formed in the substrate of the IC using conventional photolithographic and etching techniques. However, the advantages of the familiar and efficient poly plate capacitor fabrication process are difficult or impossible to apply in constructing a capacitor between interconnect layers because of the relative incompatibility of the semiconductor fabrication processes used prior to metal deposition compared to the fabrication processes used afterward to construct the interconnect layers and the IMD insulating material. Since doped polysilicon, a semiconductor, is used as an electrode, the charge within the electrode is spread over a space charge region in the electrode. The speed at which such a capacitor operates is limited because the charge in the electrode is distributed across a space charge region as a capacitor in series with the poly capacitor.

It is with respect to these and other background considerations that the present invention has evolved.

SUMMARY OF THE INVENTION

The present invention relates to a new and improved MIM capacitor, and a method of fabricating it, which facilitates the integration of its manufacturing process with the construction of the interconnect layers and the IMD insulating material. The overall process employed is similar to familiar photolithographic and etching steps used to fabricate poly plate capacitors, except that the materials employed are compatible with and integrated with the formation of the conductors of the interconnect layers and the IMD insulating material between the interconnect layers. The capacitor construction itself facilitates using conventional photolithographic and etching steps, and the construction process and materials used make for a straightforward construction of the capacitor plates and their connection to the interconnect layers. The capacitor preferably employs a horizontal plate configuration, with no complex shapes such as trenches, U-shaped plates, cylinders or the like. The capacitor materials and its construction achieve more precise and linear response characteristics. Moreover, one of the plates of the capacitor is integrated with a layer of metal in an interconnect, thereby facilitating the simultaneous fabrication of the interconnect layer and a part of the capacitor. Because of the reliability achieved from the straightforward construction, more control over the capacitive characteristics is achieved. The risks of an improperly formed capacitor and of diminished effectiveness of the IC itself are greatly diminished.

The present invention makes use of a discovery that involves controlling the temperature during the fabrication process to prevent the growth of material grains in the interconnect layer which becomes one of the capacitor plates. By preventing the growth of the material grains in the capacitor plates, deformation of the capacitor plates is avoided and a smooth even configuration of the plates is achieved to preserve the value and precision of the capacitance. In contrast, uneven plates from material grain growth adversely influence the capacitance value as a result of the non-uniform thickness of the dielectric material between the capacitor plates, or may promote shorting of the capacitor plates and destruction of the capacitor.

These and other improvements are achieved in an interconnect-integrated capacitor which is embedded in an IC having an interconnect layer where one of the plates of the capacitor comprises a portion of the interconnect layer. Additional preferred aspects of the present invention relate to the interconnect layer having multiple conductive layers and one of the capacitor plates comprising one of the conductive layers. One of the conductive layers of the interconnect layer is subject to grain growth above a certain temperature, so it is preferred that parts of the capacitor be formed at temperatures below that at which grains in the conductive layer may grow. Preferably, the IC has a second interconnect layer, the interconnect layers are separated by an IMD layer, a top plate of the capacitor is formed between the interconnect layers, and a bottom plate comprises a portion of one of the interconnect layers. Via interconnects preferably electrically connect the second interconnect layer to the top plate and the bottom plate. The via interconnects are of different depths, so it is further preferred that a second dielectric layer, preferably made of the same material as the dielectric layer between the capacitor plates, is on top of the top plate, and both dielectric layers provide etch stops for forming the vias for the via interconnects.

The previously mentioned and other improvements are achieved in a method of fabricating a MIM capacitor in an IC having multiple interconnect layers, which generally involves the steps of forming a capacitor comprising two capacitor plates and using one of the interconnect layers to define one of the capacitor plates. Additional preferred method aspects of the present invention relate to forming a dielectric layer on top of one of the interconnect layers and forming a top plate on top of the dielectric layer. A bottom plate is preferably formed from a portion of the interconnect layer on top of which the dielectric layer is formed. A second dielectric layer, preferably of the same material as the first dielectric layer, is formed on top of the top plate, and both dielectric layers preferably serve as etch stops. Vias are preferably etched through an IMD layer to the top plate and the bottom plate at different depths, and via interconnects are formed therein. Etch stops, such as dielectric layers directly above each plate, are preferably used at different levels to stop each via being etched. The interconnect layer that defines one of the capacitor plates may comprise multiple layers, one of which may be subject to grain growth above a predetermined temperature, so at least part of the capacitor is preferably formed at a temperature below the predetermined temperature.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

DETAILED DESCRIPTION

Figure 1:
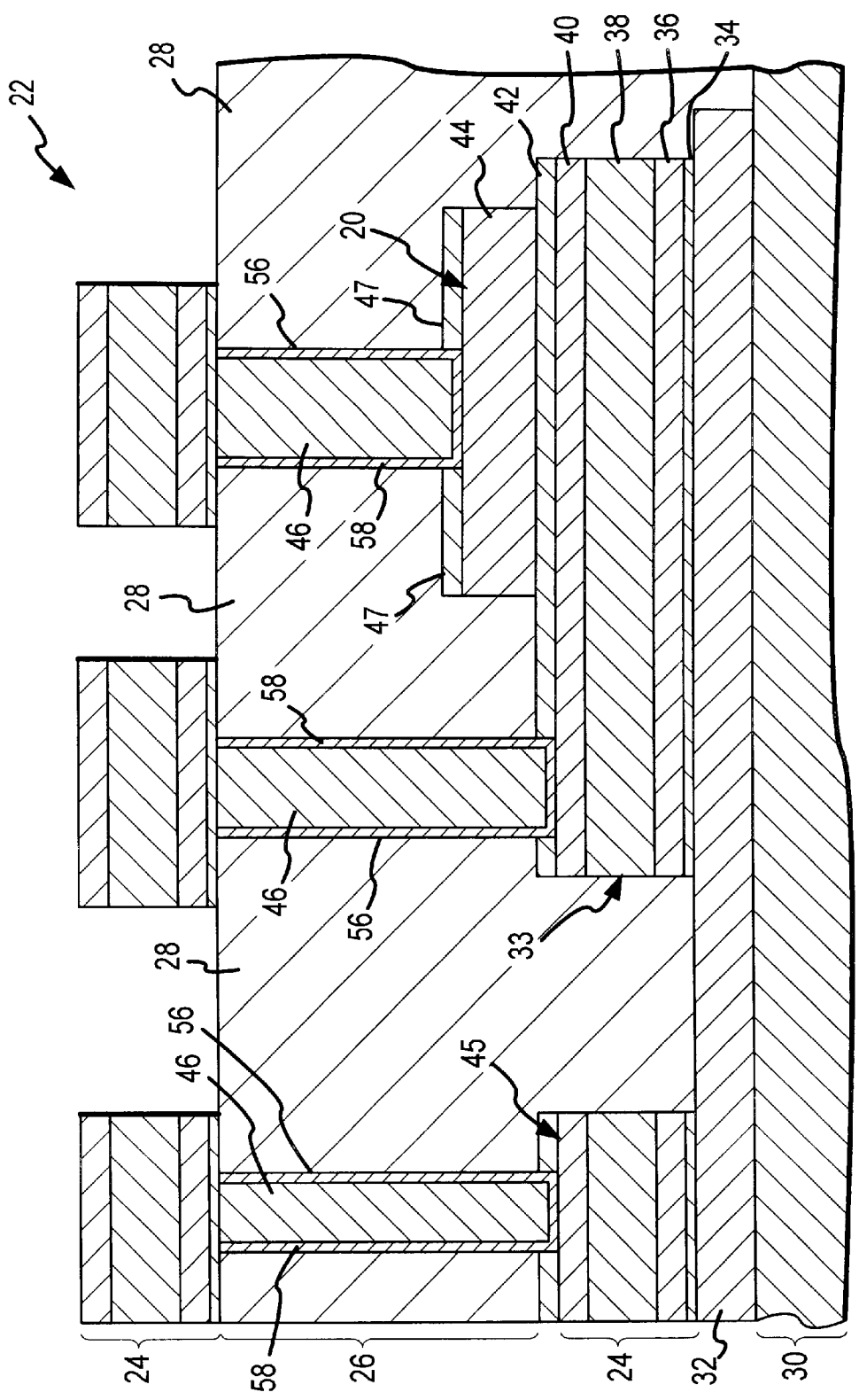
FIG. 1 is a partial, vertical cross-sectional view of an integrated circuit having multiple interconnect layers and which incorporates an interconnect-integrated metal-insulator-metal (MIM) capacitor of the present invention.

A capacitor 20 which embodies the present invention is incorporated in an integrated circuit (IC) 22 such as is shown in FIG. 1. The IC 22 is of the type having multiple layers 24 of electrical conductors known as interconnects. The electrical conductors of each interconnect layer 24 extend between and connect to the other functional components (not shown) of the IC 22. Each interconnect layer 24 is separated by a relatively thick layer 26 of intermetal dielectric (IMD) insulating material 28. The IMD insulating material 28 of each IMD layer 26 electrically insulates the conductors of the interconnect layers 24 from one another and electrically insulates the other components within the IC 22 from one another.

The multiple interconnect layers 24 and the IMD layers 26 are built or layered above one another and overlying a substrate 30 of the IC 22. The substrate 30 serves as the foundation for the IC and its functional components formed in and on the substrate 30. The functional components of the substrate 30 are exemplified by transistors and other semiconductor devices (not shown). The ability to fabricate an IC 22 with multiple interconnect layers 24 has been made possible by the present advanced state of planarization processes, for example chemical mechanical polishing (CMP).

A relatively thick interlayer dielectric (ILD) layer 32 of insulating dielectric material, such as silicon dioxide, is formed over the substrate 30 to support all of the above positioned interconnect layers 24 and their interlayer dielectric material 28. The purpose of the ILD layer 32 is to insulate the interconnect layers 24 from the functional components or other interconnect conductors below. Via interconnects or other contacts (not shown) are typically formed in the ILD layer 32 to connect the interconnect layers 24 to the functional components in the substrate. Alternatively, the ILD layer 32 may be any IMD layer overlaying any interconnect layer 24.

The construction of each interconnect layer 24 is conventional. Each interconnect layer 24 is preferably formed as a composite of a plurality of distinct metal layers 34, 36, 38 and 40, as shown, each of which is separately deposited during the course of constructing the interconnect layer 24. The layer 34 is preferably formed of titanium (Ti) and is approximately 200 angstroms thick. The layer 36 is preferably formed of titanium nitride (TiN), is approximately 480 angstroms thick, and is formed on top of the layer 34. The layer 38 is a relatively thick layer of aluminum or an aluminum alloy (such as including about 0.5% copper or other appropriate material), approximately 4200 angstroms thick. The aluminum layer 38 is deposited on top of the titanium nitride layer 36. Lastly, another layer 40 of titanium nitride is preferably formed on top of the aluminum layer 38. Above the titanium nitride layer 40, another IMD layer 26 is deposited to begin another interconnect layer 24.

The aluminum layer 38 is the primary electrical conductor of the interconnect layers 24. To improve the reliability of the interconnect layer 24 the titanium nitride layers 36 and 40 are used to provide a good stress of transition between the aluminum layer 38 and the adjacent IMD layer 26 and ILD layer 32. The titanium layer 34 provides a high-conductivity layer to assure a good conductive connection between the titanium nitride layer 36 and the via interconnects connected to the interconnect layer 24. The upper titanium nitride layer 40 also serves as an anti reflection coating (ARC) to prevent light reflection during photolithography processes into undesired locations within photoresist material (not shown in FIG. 1) which is typically applied during photolithographic fabrication processes. The entire stack of metal layers 34, 36, 38 and 40 forms a bottom electrode or plate 33 of the capacitor 20. Alternatively, one of the metal layer, such as the metal layer 40, may function as the bottom electrode or plate 33 of the capacitor 20.

The capacitor 20 is formed by a metal layer or portion of the lower interconnect layer 24, by a layer of capacitor dielectric material 42 deposited on the lower interconnect layer 24, and by a layer of metal 44, preferably titanium nitride, formed on top of the capacitor dielectric material 42. The portion of the lower interconnect layer 24 below the capacitor dielectric material 42 constitutes the lower plate 33 of the capacitor 20. Preferably, the capacitor dielectric material 42 is silicon nitride, although the capacitor dielectric material 42 may be selected from other materials, such as silicon dioxide or any other appropriate insulating material, to provide desired dielectric characteristics.

Examples of dielectric materials suitable for use in the capacitor 20 are described in the sixth and seventh above-referenced U.S. patent applications. The thickness of the layer 42 of capacitor dielectric material is about 300 angstroms to about 600 angstroms (and preferably approximately 450 angstroms) or other thickness as is appropriate for the capacitance desired and the dielectric material used. The layer 44 of titanium nitride on top of the layer 42 of capacitor dielectric material constitutes the other or upper plate of the capacitor 20. The upper capacitor plate layer of titanium nitride 44 is relatively thick, for example, approximately 1,000 angstroms.

Because both the upper capacitor plate 44 and the lower capacitor plate 36 are preferably formed of titanium nitride, a refractory metal, substantial additional resistance to deformation of the capacitor plates is obtained to resist the effects of thermal excursions during fabrication of the IC 22. Further still, the metal plates 40 and 44 cause the capacitor 20 to exhibit a linear response characteristic to electrical signals, thereby making the capacitor 20 more suitable for use as an analog circuit element or as a digital circuit element in the IC 22, if desired or required.

IMD insulating material 28 covers the capacitor 20, and fills the space between the capacitor 20 and the horizontally adjoining components 45 of the interconnect layer 24. Via interconnects 46 are formed through the IMD layer 26. Via interconnects 46 are through-hole electrical connections between the conductors of the vertically separated interconnect layers 24, the substrate 30 and the components of the capacitor 20. The via interconnects 46 are shown in FIG. 1 as connecting conductors of the upper interconnect layer 24 to the upper capacitor plate 44, to the lower capacitor plate 33, and to the lower interconnect layer 24 itself. The via interconnect which extends from the upper interconnect layer 24 to the top plate 44 of the capacitor 20 is shorter in length or vertical height than the via interconnect 46 which extends from the upper interconnect layer 24 to the lower capacitor plate 33 or to the lower interconnect layer 24. The locations of the via interconnects 46 are selected to achieve the necessary connections to the functional circuitry within the IC 22.

An optional dielectric layer 47 may be deposited on top of the top plate 44 to provide an etch stop for the via etched in the process of forming the via interconnect 46 extending from the upper interconnect layer 24 to the top plate 44 of the capacitor 20. The layer 47 is preferably made of the same material as the capacitor dielectric layer 42, so the via etch process will stop on layers 42 and 47 while etching the vias for the via interconnects 46. The dielectric layer 47 will thereby prevent a portion of the top plate 44 from being etched away or degraded while the adjoining via continues to be etched through the IMD layer 26 to the top of the bottom plate 33. The fabrication process described below in connection with FIGS. 2–6 includes the layer 47, but an alternative fabrication process that does not include the layer 47 is within the scope of the present invention.

The individual conductor traces (54, FIGS. 5 and 6) of the of the interconnect layers 24 are separated from one another so that the functional connectivity is achieved in each interconnect layer, as is known. FIG. 1 does not illustrate the individual conductor traces or the functional connectivity, but instead simply illustrates the fact that connections through the via interconnects 46 are possible to all of the components of the capacitor 20 and to the lower interconnect layer 24.

After each layer 26 of IMD material 28 and the via interconnects 46 are formed, the upper surfaces of the IMD layer 26 and via interconnects 46 are planarized by conventional CMP procedures. Thereafter the upper interconnect layer 24 is formed on top of the planarized IMD layer 26.

The process of forming the interconnect-integrated MIM capacitor 20 shown in FIG. 1 is described in conjunction with steps of a fabrication process shown in FIGS. 2–6. Conventional fabrication techniques are used to deposit, pattern and etch each of the layers of materials shown and described in the following steps. Some of the process steps described hereunder for the formation of the MIM capacitor 20 are similar to familiar process steps used in the construction of polysilicon structures in the underlying substrate.

Figure 2:
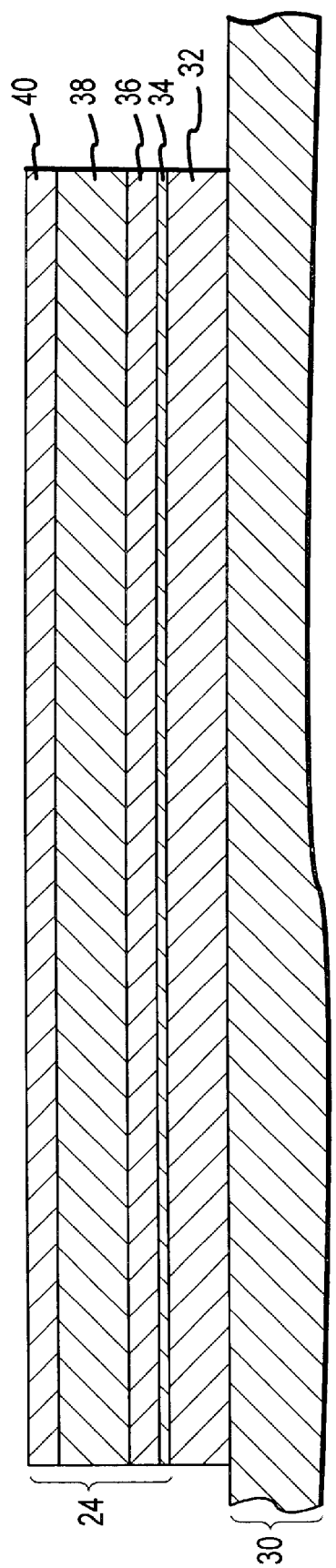
FIGS. 2–6 are a series of partial, vertical cross-sectional views which illustrate a sequence of steps employed in the fabrication of the MIM capacitor shown in FIG. 1.

The fabrication process begins at the stage shown in FIG. 2, where the conventional lower interconnect layer 24 has been formed by conventional techniques, after the ILD layer 32, if required, has been deposited on top of the substrate 30. To begin the formation of the lower interconnect layer, the relatively thin titanium layer 34 is deposited on top of the insulating ILD layer 32. The titanium nitride layer 36 is deposited on top of the titanium layer 34. The aluminum layer 38 is deposited on top of the titanium nitride layer 36, and the top titanium nitride layer 40 is deposited on top of the aluminum layer 38.

Figure 3:
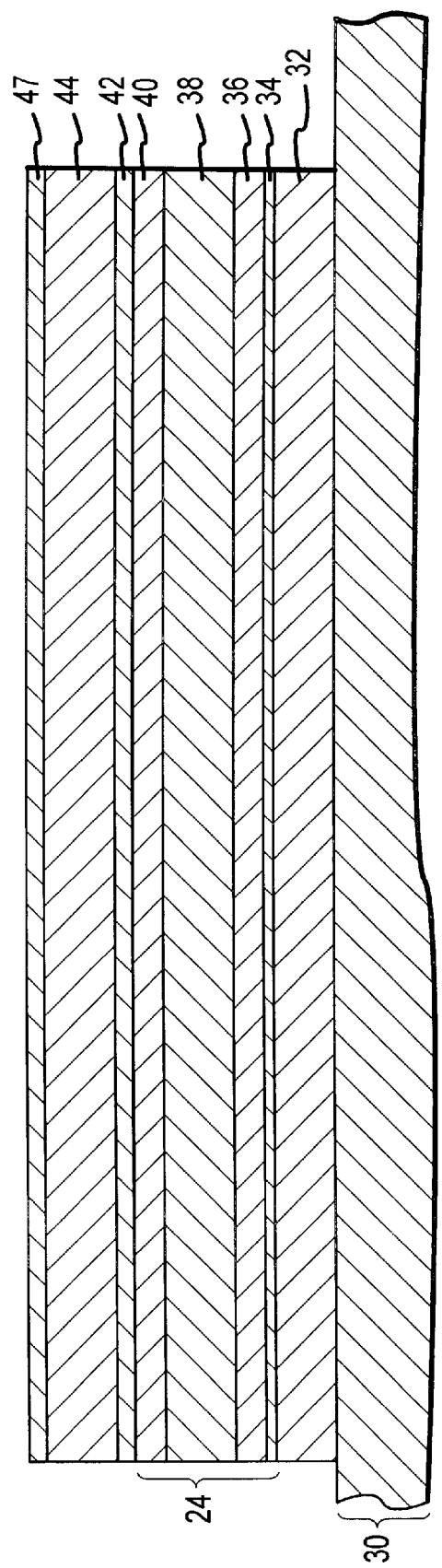

At the stage shown in FIG. 3, the capacitor dielectric layer 42 has been deposited on top of the titanium nitride layer 40. The capacitor top plate titanium nitride layer 44 has been deposited on top of the dielectric layer 42, and the optional etch stop dielectric layer 47 has been deposited on top of the titanium nitride layer 44.

To prevent the growth of the metal grains in the aluminum layer 38 and to avoid the resulting plastic deformation of the aluminum layer 38 caused by metal grain growth, it is preferable that the material of the capacitor dielectric layer 42 be deposited at about 420 degrees Centigrade or less. By so limiting the temperature, the grains of material within the aluminum layer 38 do not become sufficiently plastic to grow in size. A significant growth of the aluminum grains will cause an uneven or nonplanar configuration of the aluminum layer 38. The resulting unevenness will cause a corresponding unevenness in the titanium nitride layer 40 and in the capacitor dielectric material 42, because the deformed aluminum layer 38 pushes upward on the layers 40 and 42. Unevenness in the thickness of the capacitor dielectric material 42 results in unpredictable capacitor characteristics. The unevenness, if sufficiently exaggerated, can possibly perforate the capacitor dielectric material 42 to cause shorting of the capacitor plates and failure of the capacitor 20.

Figure 4:
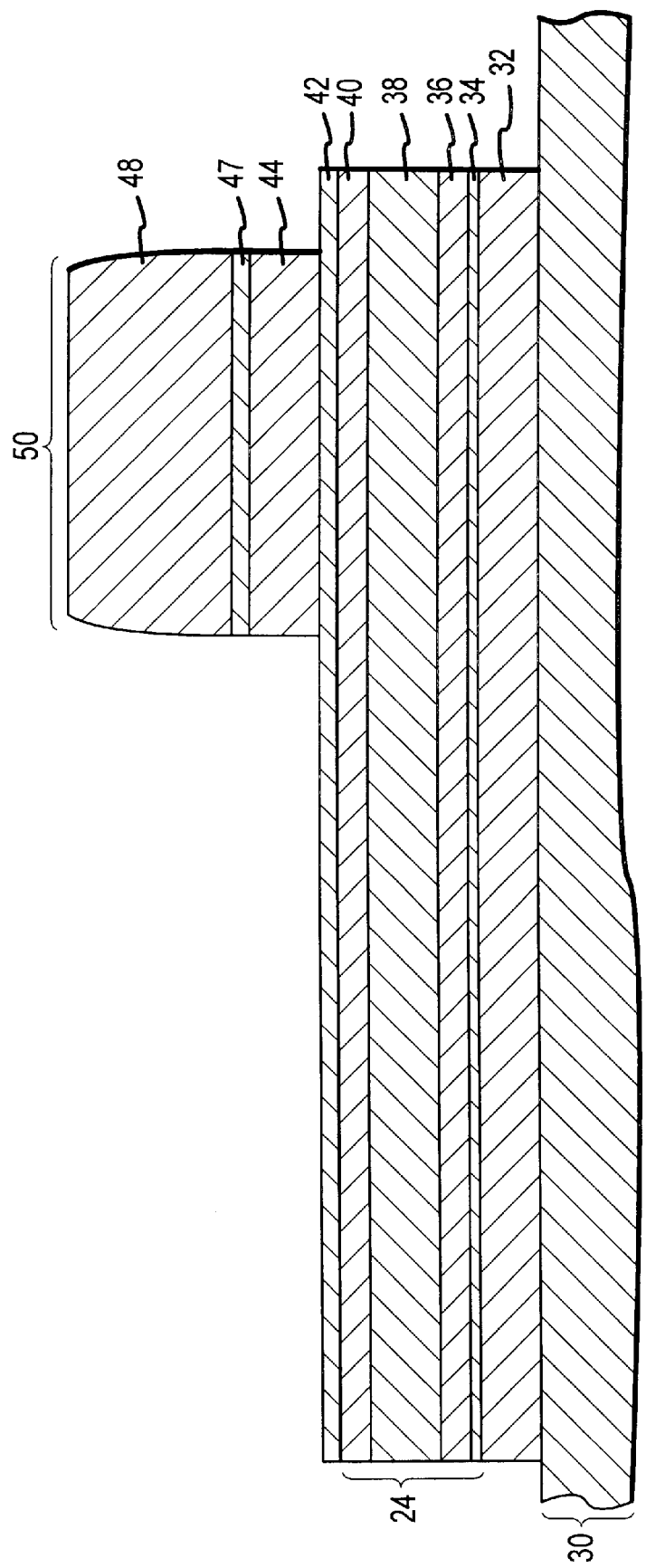

FIG. 4 illustrates the formation of the capacitor top plate 44. A photoresist layer 48 is deposited on top of the optional dielectric layer 47 and a standard photolithography procedure patterns the photoresist layer 48 to define an area 50 covered by the remaining photoresist layer 48. The area 50 defines the size of the top plate 44 of the capacitor 20 (FIG. 1). The optional dielectric layer 47 and the titanium nitride layer 44 are etched away outside of the area 50 which is protected and covered by the remaining photoresist layer 48. The titanium nitride layer 44 is etched using a plasma etch process that removes the titanium nitride and stops on the capacitor dielectric layer 42. The remaining portion of the titanium nitride layer 44 forms the top capacitor plate 44.

Figure 5:
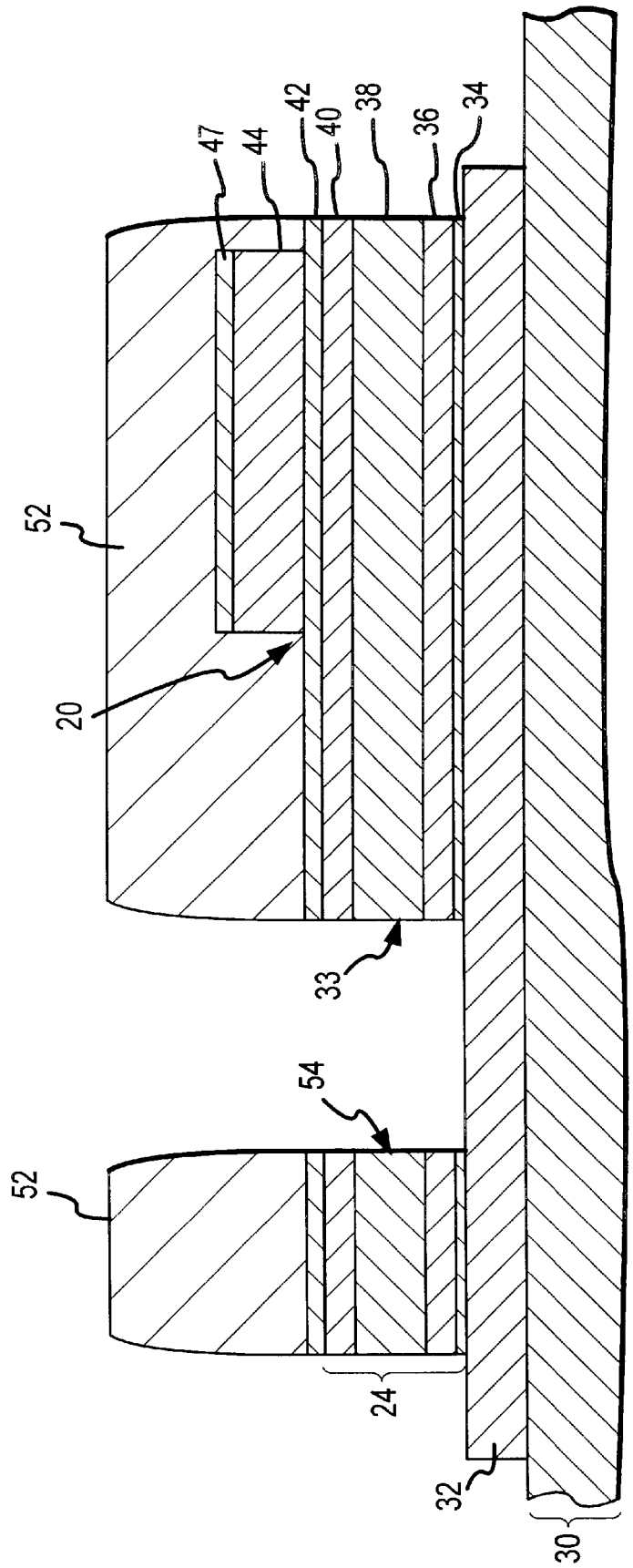
Figure 6:
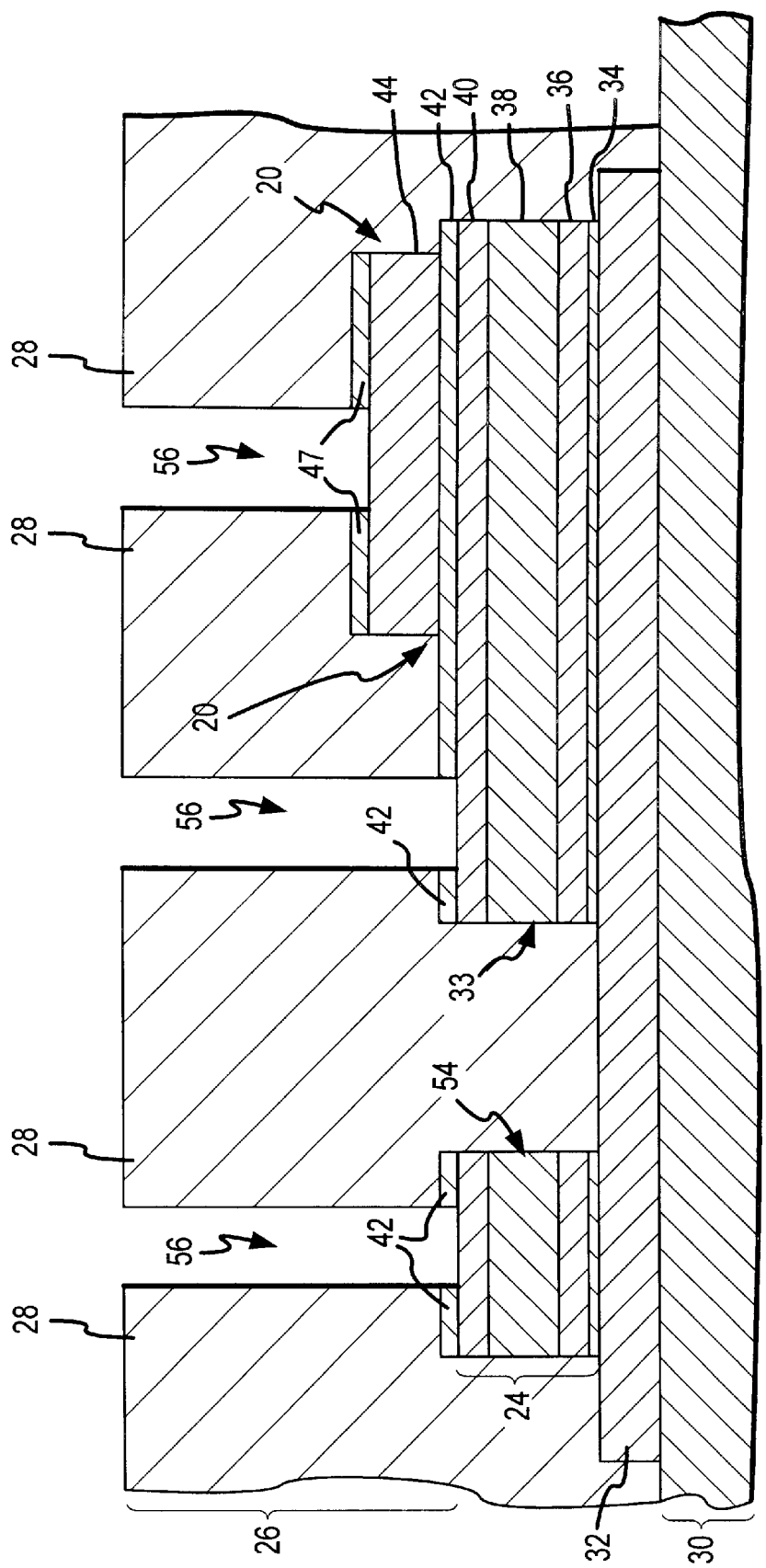

At the stage shown in FIG. 5, the previous applied photoresist layer 48 (FIG. 4) has been removed, and a new photoresist layer 52 has been added and patterned using conventional photolithographic techniques. The pattern of the photoresist layer 52 defines the bottom capacitor plate 33 and other conductor traces in the lower interconnect layer 24, as illustrated by the conductor trace 54. Since the capacitor dielectric layer 42 was left in place by the previous processes, it may also act as an anti-reflective coating during the exposure steps associated with the photolithographic patterning of the photoresist layer 52. The capacitor dielectric layer 42 and the interconnect layer 24 outside of the area defined by the patterned photoresist layer 52 are etched away and down to the insulator ILD layer 32 to electrically isolate the lower capacitor plate 33 and the other conductor traces 54 of the lower interconnect layer 24. At the point in the process flow illustrated by FIG. 5, the structure of the capacitor 20 itself is essentially completed, afterwards the layer 52 of photoresist is removed. The remainder of the process flow, as illustrated by FIGS. 1 and 6, generally involves patterning and etching the conductor traces 54 in the interconnect layer 24, adding the IMD layer 26, and forming the via interconnects 46 through the IMD layer 26 to the capacitor plates 33 and 44 and to the top titanium nitride layer 40 of the conductor traces 54 of the lower interconnect layer 24.

After the photoresist layer 52 (FIG. 5) is removed, the interconnect layer 24 and the capacitor 20 and the spaces therebetween are covered with the dielectric material 28 of the IMD layer 26. Thereafter, the IMD layer 26 is planarized, and holes or vias 56 are etched into the IMD layer 26 within which to form the via interconnects 46 (FIG. 1). The IMD layer 26 may be formed by a conventional high density plasma (HDP) operation, a conventional deposition and sputtering sequential operation, or other oxide deposition process that can adequately fill the spaces between remaining portions of the interconnect layer 24 and also cover the interconnect layer 24 and the capacitor 20. Alternatively, a HDP operation may be employed to only partially complete the IMD layer 26 by forming a lower HDP oxide portion (not shown) which fills the gaps between portions of the interconnect layer 24, followed by an organic tetra ethyl ortho silicate (TEOS) operation, which completes the IMD layer 26 with an oxide cap (also not shown). A TEOS deposition operation will fill the remaining vertical space in the IMD layer 26 more quickly than will an HDP operation. Afterwards, the completely-formed IMD layer 26 is cleaned and polished flat, or planarized, using an oxide CMP procedure, to provide a substantially flat surface on which to build the upper interconnect layer 24 (FIG. 1).

Vias 56 for the via interconnects 46 (FIG. 1) are formed using conventional photolithography techniques at the selected locations of the via interconnects 46. The vias 56 are preferably formed by conventional plasma etching. In the absence of the optional dielectric layer 47, the via etch process may be specified to stop on the titanium nitride layer 44 to prevent etching all the way down to and damaging the capacitor dielectric layer 42 thereunder. Since a plasma etch process will continue to sputter and thereby consume some of the titanium nitride layer 44, it is possible to damage the dielectric layer 42 even without penetrating very far into the titanium nitride layer 44. Therefore, the optional dielectric layer 47 provides the advantage of selectively etching only the dielectric material 28 and stopping on the capacitor dielectric layer 42 and the optional dielectric layer 47, which are both made of the same material, rather than permitting any portion of the top capacitor plate 44 to be damaged. Thereafter, a different etch process is employed to remove simultaneously the exposed portions of the capacitor dielectric layer 42 and the optional dielectric layer 47 at the bottom of the vias 56, and thereby allow the via interconnect 46 to electrically contact the metal at the bottom of the vias 56 as shown in FIG. 6.

The vias 56 are then lined with an appropriate layer of liner material 58, such as a thin film of titanium followed by a film of titanium nitride, on the bottom and sidewalls of the vias 56, as shown in FIG. 1. The remaining open portions of the vias 56 are then filled with plug metal, such as tungsten, followed by a metal CMP process to polish back the plugged metal and the titanium and titanium nitride layer 58 to a planar upper surface which is co-planar with the top surface of the IMD layer 26. Afterwards, the top interconnect layer 24 is constructed in a similar manner to the formation of the lower interconnect layer 24.

Although the capacitor 20 is shown and described herein as being formed on the top of the lower interconnect layer 24, it is possible in an appropriate situation to invert the general structure of the capacitor 20 and form the capacitor 20 at the bottom of the upper interconnect layer 24. In this situation, the capacitor bottom plate constitutes the capacitor plate 44, while the upper plate in this inverted capacitor configuration is formed by the upper interconnect layer 24 and/or the lower titanium nitride layer 36 of the upper interconnect layer. Appropriate via connections would be made prior to the formation of the lower capacitor plate and the upper interconnect layer, in this inverted configuration.

The MIM capacitor 20 and its method of fabrication provide the benefits and advantages of integrating the capacitor in the formation of the interconnect layer. The fabrication of the capacitor 20 is facilitated since one of its capacitor plates is integral with the interconnect layer 24, instead of being formed on top of the interconnect layer 24. Furthermore, the via connections between vertically adjacent interconnect layers and between the capacitor 20 and the next interconnect layer may be formed to etch stop layers formed integrally with the formation of the capacitor, thereby simplifying the process of forming the via interconnects 46 without resulting in damage to metal components located at different vertical heights within the IC. By depositing the capacitor dielectric material at a temperature of 420 degrees Centigrade or less, the undesirable effects of grain growth and plastic deformation in the aluminum layer of the interconnect layer are avoided, thereby preserving the desired precision and linear response characteristics of the MIM capacitor 20. Many other advantages and improvements will be apparent upon gaining a full appreciation of the present invention.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiments set forth above.

The invention claimed is:

1. In an integrated circuit (IC) having a substrate containing functional components and an interconnect layer overlying the substrate to connect selected ones of the functional components, an improvement comprising:
   a capacitor comprising two plates and a dielectric layer interposed between the two plates, a bottom one of the plates comprising a portion of the interconnect layer and a top one of the plates comprising a single metal layer.

2. An IC as defined in claim 1 wherein:
   the interconnect layer includes multiple conductive layers; and
   the bottom plate comprises a conductive layer of the interconnect layer.

3. An IC as defined in claim 1 wherein:
   the interconnect layer includes multiple conductive layers, one of which is subject to grain growth above a predetermined temperature; and
   the dielectric layer is deposited at a temperature less than the predetermined temperature.

4. An IC as defined in claim 1 wherein the two plates are substantially planar.

5. An IC as defined in claim 4 wherein the two plates are substantially horizontal.

6. An IC as defined in claim 1 of the type having a second interconnect layer overlying the interconnect layer first aforesaid and separated from the first interconnect layer by an insulating intermetal dielectric (IMD) layer, wherein:
   the bottom plate comprises a portion of the first interconnect layer; and
   the top plate is disposed between the first and second interconnect layers within the IMD layer.

7. In an integrated circuit (IC) having a substrate containing functional components, a first interconnect layer overlying the substrate and a second interconnect layer overlying the first interconnect layer and separated from the first interconnect layer by an insulating intermetal dielectric (IMD) layer, the first and second interconnect layers connecting selected ones of the functional components, an improvement comprising:
   a capacitor comprising a bottom plate and a top plate and a dielectric layer interposed between the bottom and top plates, the bottom plate comprising a portion of the first interconnect layer, the top plate being disposed between the first and second interconnect layers within the IMD layer;
   a first via interconnect connected between one portion of the second interconnect layer and the top plate; and
   a second via interconnect connected between another portion of the second interconnect layer and the bottom plate.

8. An IC as defined in claim 7 wherein the first and second via interconnects have different lengths.

9. An IC as defined in claim 7 wherein:
   the bottom plate extends horizontally beyond the top plate and connects to the second via interconnect at a location horizontally spaced from the top plate.

10. An IC as defined in claim 7 further comprising:
    a second dielectric layer overlying the top plate in addition to the dielectric layer first aforesaid interposed between the capacitor plates, the first and second dielectric layers forming an etch stop for the second and first via interconnects, respectively.

11. An IC as defined in claim 10 wherein:
    the first and second dielectric layers each comprise a dielectric material; and
    the dielectric material of the first and second dielectric layers is substantially the same material.

12. An IC as defined in claim 7 wherein:
    the interconnect layer includes multiple conductive layers; and
    the bottom plate comprises a conductive layer of the interconnect layer.

13. An IC as defined in claim 7 wherein:
    the interconnect layer includes multiple conductive layers, one of which is subject to grain growth above a predetermined temperature; and
    the dielectric layer is deposited at a temperature less than the predetermined temperature.

14. An IC as defined in claim 7 wherein the two plates are substantially planar.

15. An IC as defined in claim 14 wherein the two plates are substantially horizontal.

* * * * *